US005561638A

United States Patent [19]
Gibson et al.

[11] Patent Number: 5,561,638
[45] Date of Patent: Oct. 1, 1996

[54] MULTI-PORT SRAM CORE ARRAY

[75] Inventors: Garnet F. R. Gibson, Nepean; Steven W. Wood, Kanata, both of Canada

[73] Assignee: Northern Telecom Limited, Montreal, Canada

[21] Appl. No.: 565,267

[22] Filed: Nov. 30, 1995

[51] Int. Cl.$^6$ .................................................. G11C 8/00
[52] U.S. Cl. ........................... 365/230.05; 365/230.08; 365/189.01; 365/189.05
[58] Field of Search .................. 365/230.05, 230.08, 365/189.01, 189.05

[56] References Cited

U.S. PATENT DOCUMENTS

| | | | |
|---|---|---|---|
| 4,958,322 | 9/1990 | Kosugi et al. | 365/189.01 |
| 5,345,425 | 9/1994 | Shikatani | 365/189.01 |
| 5,473,574 | 12/1995 | Clemen et al. | 365/230.05 |

OTHER PUBLICATIONS

"A 180–MHz 0.8–um BiCMOS Modular Memory Family of DRAM and Multiport SRAM", Silburt et al, IEEE Journal of Solid–State Circuits, vol. 28, No. 3, Mar. 1993.

"A 2.2 W, MHz Superscalar RISC Microprocessor", Gerosa et al, IEEE Journal of Solid–State Circuits, vol. 29, No. 12, Dec. 1994.

*Primary Examiner*—David C. Nelms
*Assistant Examiner*—Trong Phan
*Attorney, Agent, or Firm*—George MacGregor

[57] ABSTRACT

A multi-port SRAM (static random access memory) core array has a core cell with a single-ended, pseudo-differential write access port and differential, indirect access read ports. The architecture of the features of the multi-port SRAM core array allows direct scaling of the number of write and read access ports to any practical limit with no adverse effects on cell stability margins and therefore data integrity.

13 Claims, 3 Drawing Sheets

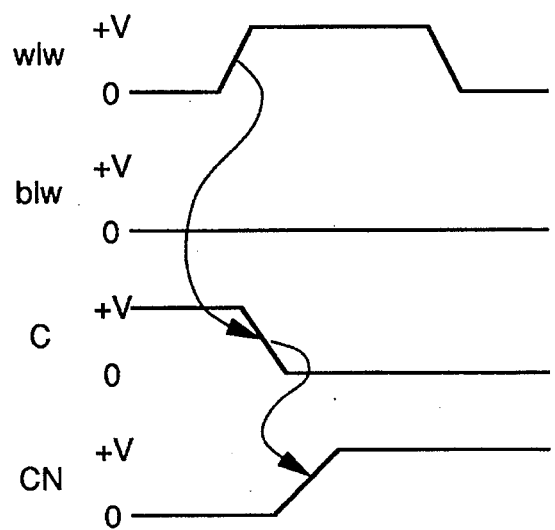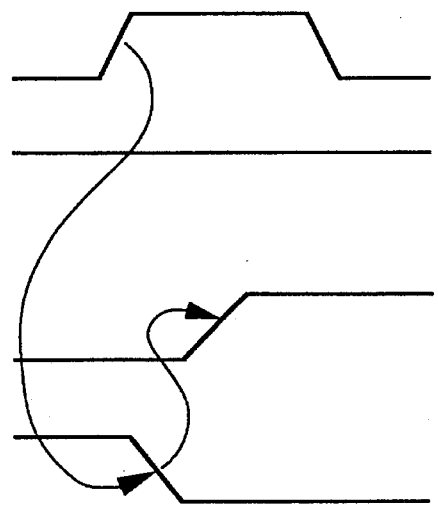
FIG. 3 (a)   FIG. 3 (b)
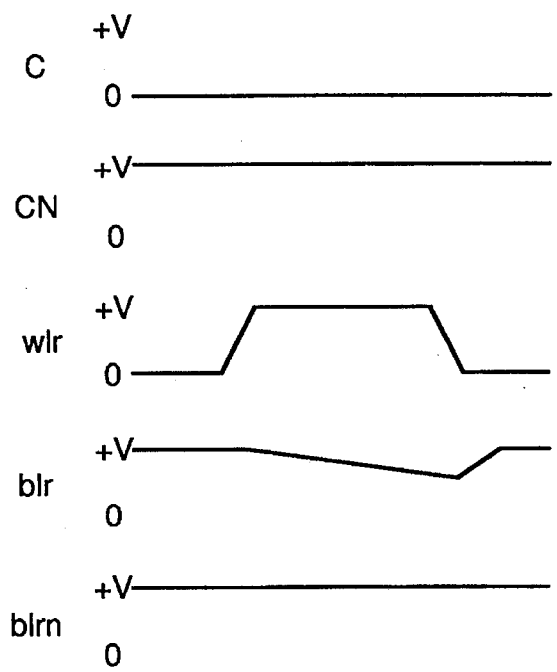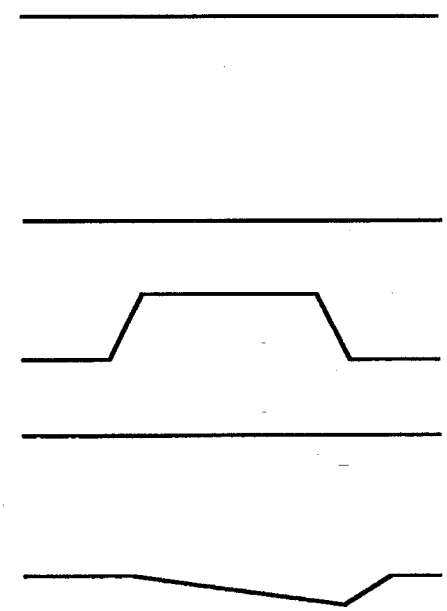
FIG. 3 (c)   FIG. 3 (d)

MULTI-PORT SRAM CORE ARRAY

TECHNICAL FIELD

The present invention relates to a multi-port SRAM (static random access memory) core array.

BACKGROUND ART

Well known RAMs have at least one address port and include storage elements (core cells). In a paper by A. L. Silburt et al entitled "A180-MHz 0.8-µm BiCMOS Modular Memory Family of DRAM and Multiport SRAM", IEEE Journal of Solid-State Circuits, Vol. 28, No. 3, Mar. 1993, p. 222, at 227 and 228 show various RAM core arrays.

It is a problem to develop a practical, high-speed, low-power and area efficient core cell to support multiple ports (e.g., a single high-speed write port and four high-speed read ports). A conventional five port cell would have required additional access lines and significant area to achieve adequate stability margins.

In a paper by G. Gerosa et al entitled "A 2.2 W, 80 MHz Superscalar RISC Microprocessor", IEEE Journal of Solid-State Circuits, Vol., 29, No. 12, December 1994, p.1440, at 1447 shows a RAM storage element with single-ended write access structure. The disclosed structure of five ports (one write port and four read ports) includes a plurality of transistor stacks which are connected to respective bit lines. Each transistor stack has top and bottom MOSFETs (metal oxide semiconductor field effect transistors). The drain-source circuits of the top and bottom MOSFETs are series-connected. The gates of the bottom MOSFETs are connected to respective read port lines. The gates of all top MOSFETs are in parallel connected to the core cell. This results in unnecessary loading on the bit line, since the full MOSFET channel capacitance and internal diffusion capacitance of the top MOSFET in the stack is added to the bit line load for every core cell storing data which will set the gate of the top MOSFET "high". This may as much as double the bit line load, resulting in significantly reduced performance. Furthermore, the implementation described in the paper uses only single-ended read access which, for all but the smallest memories, may result in substantially inferior read performance.

U.S. Pat. No. 4,958,322 granted to Kosugi et al on Sep. 18, 1990 discloses a pseudo memory device wherein DRAM (dynamic random access memory) is operated to function as an SRAM.

SUMMARY OF THE INVENTION

It is an object of the present invention to provide an improved multi-port SRAM core array.

In accordance with the most general aspect of the present invention, there is provided a multi-port SRAM core array comprising: at least one pseudo-differential write access port; at least one differential indirect read access port; and a core cell having first and second data input and output terminals, the core cell performing a data latch function for storing binary data.

In one example of the multi-port SRAM core array, a pseudo-differential write access is provided by conductive-nonconductive means. During a "write" operation mode, the conductive-nonconductive means provides a binary data signal to either of the terminals of the core cell, in response to a write word line signal. The data signal corresponds to "zero" or "one" derived from a write bit line. For example, the conductive-nonconductive means includes FETs. The drain-source of one of the FETs is connected to the terminal of the core cell and a write bit line on which the binary data signal is present. The drain-source of another FET is connected to the other terminal of the core cell and an indirect bit write access FET. The binary data is written into the core cell via the conductive FET and latched therein.

In another example of the multi-port SRAM core array, the core cell is connected to a plurality of read word lines and a plurality of pairs of read bit lines. During a "read" operation mode, differential data is present on a pair of bit lines. The differential indirect read access is provided by a pair of gating means for one pair of bit lines, each gating means being connected between each of the terminals of the core cell and one of the differential read bit lines. For example, the gating means includes FETs which are controlled by read word line signals. While a read word line is active (i.e., the "read" operation mode), the FET (of the gating means) to which the read word line corresponds transfers the data latched in the core cell in a differential form to the pair of bit lines.

In accordance with another aspect of the present invention, there is provided a multi-port SRAM core array comprising: a core cell having first and second data input and output terminals, the core cell performing a data latch function for storing binary data; conductive-nonconductive means for providing, during a write operation mode, a binary data signal to either of the terminals of the core cell, in response to a write word line signal, the data signal corresponding to zero or one derived from a write bit line; and a plurality of pairs of gating means, each being connected between the respective terminal of the core cell and a respective one of a plurality of differential read bit lines. In the multi-port SRAM, differential data is present on a pair of read bit lines during a read operation mode in response to a word line read signal.

BRIEF DESCRIPTION OF THE DRAWINGS

An embodiment of the present invention will now be described by way of example with reference to the accompanying drawings in which:

FIGS. 3(a)–3(d) are timing charts which illustrate the operation of the multi-port SRAM core array shown in FIG. 1.

DETAILED DESCRIPTION OF THE PREFERRED EMBODIMENTS

The following description assumes, for simplicity and purely by way of example, that FETs referred to are MOSFETs and a supply voltage +Vdd is 5.0 volts. The FETs are N-channel MOSFETs. p-channel MOSFETs are specifically identified.

I. Structure of the Embodiment

Figure 1:
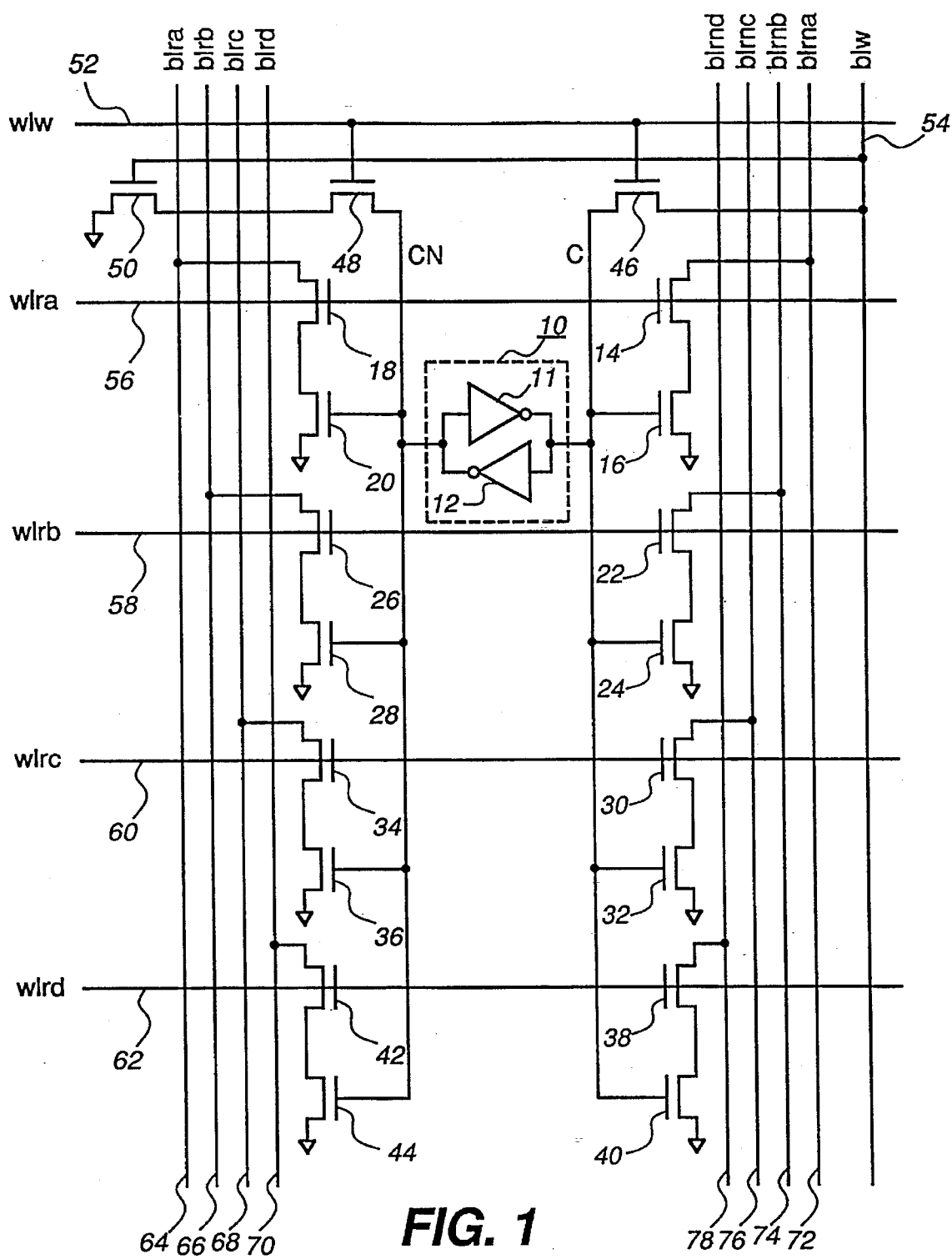
FIG. 1 is a circuit diagram of a multi-port SRAM core array of an embodiment according to the present invention.

The multi-port SRAM core array shown in FIG. 1 consists of four differential read ports with indirect data access via gated, bit line pull-down transistors and one single-ended write-only port with local bit line inversion to give pseudo-differential write access.

The multi-port SRAM core array shown in FIG. 1 has a five-port storage element (core cell) and includes one write port and four differential read ports with indirect data access.

The multi-port SRAM core array has a core cell 10 which includes two inverter latches 11 and 12. Each of the inverter latches 11 and 12 has a CMOS (complementary metal oxide semiconductor) inverter. The input and the output terminals of the inverter latch 11 are connected to the output and the input terminals of the inverter latch 12, respectively.

The source of a FET 14 is connected to the drain of a FET 16 and the source of a FET 18 is connected to the drain of a FET 20. Similarly, the source of a FET 22 is connected to the drain of a FET 24 and the source of a FET 26 is connected to the drain of a-FET 28. The source of a FET 30 is connected to the drain of a FET 32 and the source of a FET 34 is connected to the drain of a FET 36. The source of a FET 38 is connected to the drain of a FET 40 and the source of a FET 42 is connected to the drain of a FET 44.

The output terminal of the inverter latch 11 and the input terminal of the inverter latch 12 are connected to the gates of the FETs 16, 24, 32 and 40 and the drain of a FET 46. The input terminal of the inverter latch 11 and the output terminal of the inverter latch 12 are connected to the gates of the FETs 20, 28, 36 and 44 and the drain of a FET 48 whose source is connected to the drain of a FET 50. The sources of the FETs 16, 20, 24, 28, 32, 36, 40, 44 and 50 are connected to the ground terminal.

The gates of the FETs 46 and 48 are connected to a line 52 on which a write word line signal wlw is present. The gate of the FET 50 and the source of the FET 46 are connected to a line 54 on which a write bit line signal blw representing data "zero" or "one" is present.

A line 56 on which a word line read signal wlra is present is connected to the gates of the FETs 14 and 18. A line 58 on which a word line read signal wlrb is present is connected to the gates of the FETs 22 and 26. A line 60 on which a word line read signal wlrc is present is connected to the gates of the FETs 30 and 34. A line 62 on which a word line read signal wlrd is present is connected to the gates of the FETs 38 and 42.

The drains of the FETs 18, 26, 34 and 42 are connected to bit lines 64, 66, 68 and 70, respectively, on which read bit line signals blra, blrb, blrc and blrd are present. The drains of the FETs 14, 22, 30 and 38 are connected to bit lines 72, 74, 76 and 78, respectively, on which read bit line signals blrna, blrnb, blrnc and blrnd are present. The bit lines 64 and 72, 66 and 74, 68 and 76, 70 and 78 are pairs of bit lines and on the respective pairs, the read bit line signals blra and blrna, blrb and blrnb, blrc and blrnc, and blrd and blrnd are which are differential signals are present.

Figure 2:
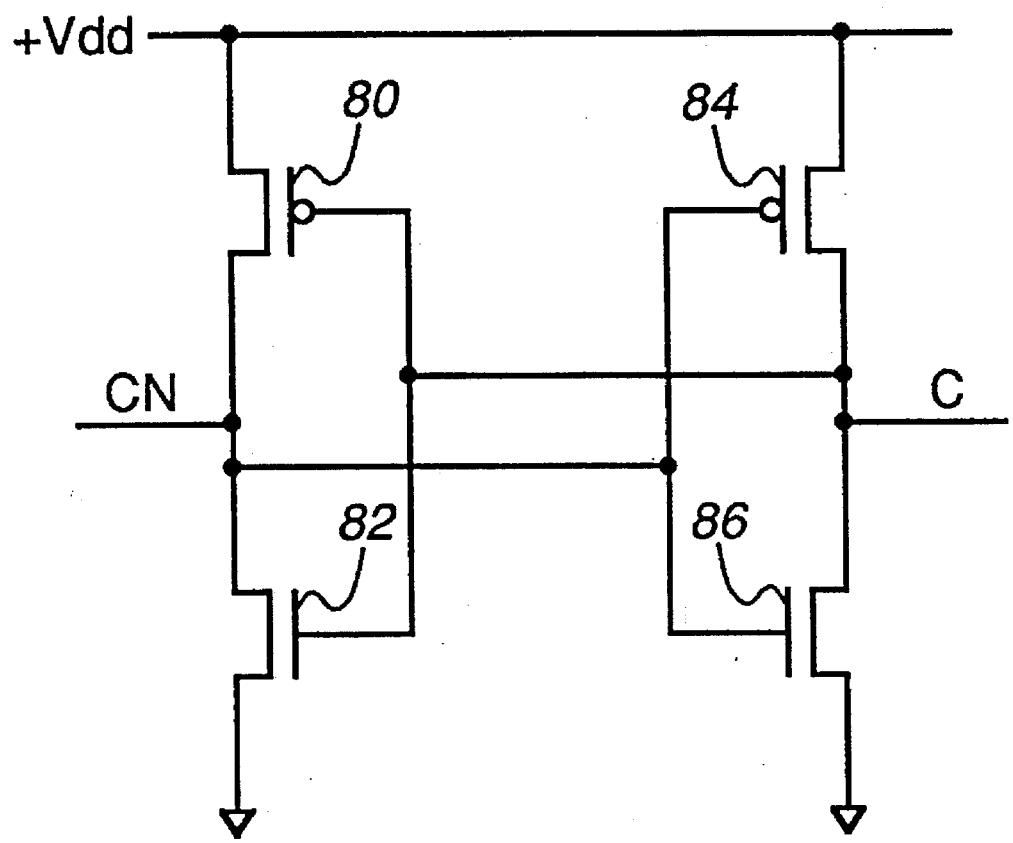
FIG. 2 is a detail diagram of the core cell shown in FIG. 1.

FIG. 2 shows a detail of the core cell 10 of the multi-port SRAM core array. The core cell 10 is a well known SRAM storage element which includes two CMOS inverters. In FIG. 2, the drains of a P-channel FET 80 (a load device) and an N-channel FET 82 (a drive device), which define one CMOS inverter, are connected to the gates of a p-channel FET 84 (a load device) and an N-channel FET 86 (a drive device), which define the other CMOS inverter. Similarly, the drains of the FETs 84 and 86 are connected to the gates of the FETs 80 and 82. The sources of the FETs 80 and 84 are connected to the voltage terminal of the supply voltage +Vdd (5.0 volts). The sources of the FETs 82 and 86 are connected to the ground terminal. The junction of the drains of the FETs 80 and 82 defines node CN. The junction of the drains of the FETs 84 and 86 defines node C. Nodes CN and C are data input and output terminals of the core cell 10.

II. Operation of the Embodiment

FIG. 3(a)–3(d) are timing charts which illustrates the operation of the multi-port SRAM core array shown in FIGS. 1 and 2. Operation of the multi-port SRAM core array will now be described with reference to FIGS. 1, 2 and 3(a)–3(d).

II-1. Write Mode

The write access port of the embodiment multi-port SRAM core array is single-ended. A single-ended write port is desirable to reduce write power and may eliminate, for example, 50% of the write bit lines from the core array as compared to traditional differential writes.

The FET 46 provides the traditional single-ended N-channel access to node C, resulting in high-speed write access for writing data "zero". The FET 46 is easily margined for high-speed writing against the weak p-channel pull-up FET 84 since it is in common-source mode. However, the FET 46 has insufficient drive to write data "one" into the core cell 10 (i.e., node C "high"), since it would be in the source-follower pull-up mode (by the FET 86) where drive capability is significantly reduced. Marginlug of the N-channel pull-down FET 86 in the core cell 10 versus the FET 46 is not feasible for high-speed write access. To achieve the high-speed write to data "one", a pseudo bit line inversion is applied through the FETs 48 and 50 to pull node CN towards ground, when both the write bit line signal blw on the line 54 and the write word line signal wlw on the line 52 are "high". The FET 48 acts as the write access device, while the FET 50 gates the pull-down of node CN, when the write bit line signal blw on the line 54 contains data "one". In spite of the weak P-channel pull-up in the core cell 10, since the FETs 48 and 50 connected in series thereto are in common-source mode, the core cell 10 write speed is improved.

(i) Write a "zero" (FIG. 3(a)):

In the embodiment multi-port SRAM core array, when data "zero" or "one" is required to be written into the core cell 10, the write word line signal wlw on the line 52 is "high". In a case of data "zero", the write bit line signal blw on the line 54 is "low". In response to "high" at the write word line signal wlw, the FET 46 becomes conductive and node C is pulled-down to "low" through the on FET 46. In response to the pull-down at node C, node CN is pulled-up by the FET 80. Therefore, the FET 86 becomes on, causing node C to maintain "low".

(ii) Write a "one" (FIG. 3(b)):

In a case of data "one", the write bit line signal blw on the line 54 is "high". In response to "high" at the write word line signal wlw and the write bit line signal blw, the FETs 48 and 50 become conductive and node CN is pulled-down towards the ground level ("low"). In response to the pull-down at node CN, node C is pulled-up by the FET 84. Therefore, the FET 82 becomes on, causing node CN to maintain "low".

II-2. Read Mode

The read access port of this embodiment of the multi-port SRAM core array is differential. The indirect read data access scheme consists of the FETs 14, 16, 18 and 20. It supports a large number of parallel read ports without incurring the stability problems of traditional pass-transistor access cells, since there is never any direct access from the read bit lines (on which a differential read bit line signals blr and blrn are present) to the data storage nodes (C and CN). Thus, the cell is inherently stable under all read conditions and need only be margined to meet the write access and soft-error immunity criteria.

(i) Read a "zero" (FIG. 3(c)):

While the core cell 10 stores data "zero", nodes CN and C are "high" and "low", respectively. While the word line read signal wlra on the line 56, for example, is "high", the FETs 18 and 14 are gated. In response to "high" at node CN, the FETs 20 and 18 become on and the bit line 64 is pulled-down by the on FETs 20 and 18, with the result that the read bit line signal blra becomes "low". Because node C is "low", the FETs 16 and 14 are off and the read bit line signal blrna on the line 72 is "high". Hence, by the gating and pull-down functions of the FETs, data "zero" is read.

Similarly, while the word line read signal wlrb on the line 58 is "high", the FETs 26 and 22 are gated. In response to "high" at node CN, the FETs 28 and 26 become conductive and the bit line 66 is pulled-down by the on FETs 28 and 26, with the result that the read bit line signal blrb becomes "low". Because node C is "low", the FETs 24 and 22 are nonconductive and the read bit line signal blrnb on the line 74 is "high". Hence, differential data "zero" is read between the bit lines 66 and 74.

(ii) Read a "one", (FIG. 3(d)):

While the core cell 10 stores data "one", nodes CN and C are "low" and "high", respectively. While the word line read signal wlra on the line 56, for example, is "high", the FETs 18 and 14 are gated. In response to "high" at node C, the FETs 16 and 14 become on and the bit line 72 is pulled-down, with the result that the read bit line signal blrna becomes "low". Because node CN is "low", the FETs 20 and 18 are off and the read bit line signal blra on the line 64 is "high". Hence, by the gating and pull-down functions of the FETs, data "one" is read.

Similarly, while the word line read signal wlrb on the line 58 is "high", the FETs 26 and 22 are gated. In response to "high" at node C, the FETs 24 and 22 become conductive and the bit line 74 is pulled-down, with the result that the read bit line signal blrnb becomes "low". Because node CN is "low", the FETs 28 and 26 are nonconductive and the read bit line signal blrb on the line 66 is "high". Hence, differential data "one" is read between the bit lines 74 and 66.

Although particular embodiment of the present invention have been described in detail, it should be appreciated that numerous variations, modifications, and adaptations may be made without departing from the scope of the present invention as defined in the claims.

What is claimed is:

1. A multi-port SRAM (static random access memory) core array comprising:

at least one pseudo-differential write access port;

at least one differential indirect read access port; and a core cell having first and second data input and output terminals, the core cell performing a data latch function for storing binary data.

2. The multi-port SRAM core array of claim 1, further comprising conductive-nonconductive means for providing a pseudo-differential write access.

3. The multi-port SRAM core array of claim 2, wherein the conductive-nonconductive means provides, during a write operation mode, a binary data signal to either of the terminals of the core cell, in response to a write word line signal, the data signal corresponding to zero or one derived from a write bit line.

4. The multi-port SRAM core array of claim 3, wherein the conductive-nonconductive means includes first and second FETs (field effect transistors), the drain-source of the first FET being connected to one of the terminals of the core cell and the write bit line on which the binary data signal is present, and the drain-source of the second FET being connected to the other terminal of the core cell and an indirect bit write access FET, in which the binary data is written into the core cell via the conductive FET and latched therein.

5. The multi-port SRAM core array of claim 1, wherein the core cell is connected to a plurality of read word lines and a plurality of pairs of read bit lines, differential data being present on a pair of read bit lines during a read operation mode in response to a word line read signal.

6. The multi-port SRAM core array of claim 5, further comprising a plurality of pairs of gating means for providing a differential indirect read access.

7. The multi-port SRAM core array of claim 6, wherein one pair of gating means corresponds to one pair of read bit lines, each gating means being connected between the respective terminal of the core cell and the respective differential read bit line.

8. The multi-port SRAM core array of claim 7, wherein each gating means comprises a plurality of conductive-nonconductive means which are controlled by the respective word line read signals, the conductive-nonconductive means transferring the data latched in the core cell in a differential form to the respective pair of read bit lines, while the respective read word line is active.

9. The multi-port SRAM core array of claim 8, wherein the conductive-nonconductive means are FETs.

10. A multi-port SRAM core array comprising:

a core cell having first and second data input and output terminals, the core cell performing a data latch function for storing binary data;

conductive-nonconductive means for providing, during a write operation mode, a binary data signal to either of the terminals of the core cell, in response to a write word line signal, the data signal corresponding to zero or one derived from a write bit line; and a plurality of pairs of gating means, each being connected between the respective terminal of the core cell and a respective one of a plurality of differential read bit lines, in which differential data is present on a pair of read bit lines during a read operation mode in response to a word line read signal.

11. The multi-port SRAM core array of claim 10, wherein the conductive-nonconductive means comprises FETs.

12. The multi-port SRAM core array of claim 10, wherein each gating means comprises a plurality of conductive-nonconductive means which are controlled by the respective word line read signals, the conductive-nonconductive means transferring the data latched in the core cell in a differential form to the respective pair of read bit lines, while the respective read word line is active.

13. The multi-port SRAM core array of claim 12, wherein the conductive-nonconductive means are FETs.

* * * * *